(12) United States Patent
Shin et al.

(10) Patent No.: US 7,964,491 B2
(45) Date of Patent: Jun. 21, 2011

(54) METHOD OF FORMING METAL WIRING OF NONVOLATILE MEMORY DEVICE

(75) Inventors: Yong Chul Shin, Icheon-si (KR); Tae Kyung Kim, Cheongju-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 12/345,612

(22) Filed: Dec. 29, 2008

(65) Prior Publication Data

US 2009/0186477 A1    Jul. 23, 2009

(30) Foreign Application Priority Data

Jan. 21, 2008 (KR) ............................... 10-2008-6150
Aug. 1, 2008 (KR) ........................... 10-2008-75700

(51) Int. Cl.
*H01L 21/44* (2006.01)
(52) U.S. Cl. ................. 438/607; 438/675; 257/E21.591
(58) Field of Classification Search .................. 438/607, 438/637, 675; 257/E21.591, E21.09, E21.159, 257/E21.495
See application file for complete search history.

(56) References Cited

U.S. PATENT DOCUMENTS

| | | | | |
|---|---|---|---|---|
| 5,717,250 | A * | 2/1998 | Schuele et al. ................. | 257/754 |
| 6,284,641 | B1 * | 9/2001 | Parekh ........................... | 438/618 |
| 6,440,842 | B1 * | 8/2002 | Chang ............................ | 438/633 |
| 6,806,187 | B2 * | 10/2004 | Graettinger et al. .......... | 438/675 |
| 2002/0079581 | A1 * | 6/2002 | Graettinger et al. .......... | 257/748 |
| 2005/0014328 | A1 * | 1/2005 | Graettinger et al. .......... | 438/202 |
| 2006/0001161 | A1 * | 1/2006 | Graettinger et al. .......... | 257/751 |
| 2007/0045703 | A1 * | 3/2007 | Choi .............................. | 257/308 |
| 2007/0114586 | A1 * | 5/2007 | Graettinger et al. .......... | 257/296 |

FOREIGN PATENT DOCUMENTS

| | | |
|---|---|---|
| KR | 1020040063350 | 7/2004 |
| KR | 1020040086702 | 10/2004 |
| KR | 1020030000737 A * | 9/2005 |
| KR | 1020060069030 A * | 6/2006 |
| KR | 1020090069936 | 7/2009 |

OTHER PUBLICATIONS

Korean Office Action for application No. 10-2008-0075700, citing the attached reference(s).
Korean Notice of Allowance for 10-2008-0075700, citing the above reference(s).

* cited by examiner

*Primary Examiner* — Walter L Lindsay, Jr.
(74) *Attorney, Agent, or Firm* — Lowe Hauptman Ham & Berner LLP

(57) ABSTRACT

A method of forming metal wirings of a nonvolatile memory device include forming a first insulating layer over a semiconductor substrate including a first junction area and a second junction area, forming first and second contact holes through which the first and second junction areas are respectively exposed in the first insulating layer, forming first and second contact plugs within the first and second contact holes, etching a part of the second contact plug, thus forming a recess, forming a second insulating layer to fill the recess, forming a third insulating layer over the semiconductor substrate including the first and second insulating layers, forming a first trench through which the first contact plug is exposed a second trench through which the second contact plug is exposed by etching the third insulating layer, and forming first and second metal wirings within the first and second trenches, respectively.

33 Claims, 14 Drawing Sheets

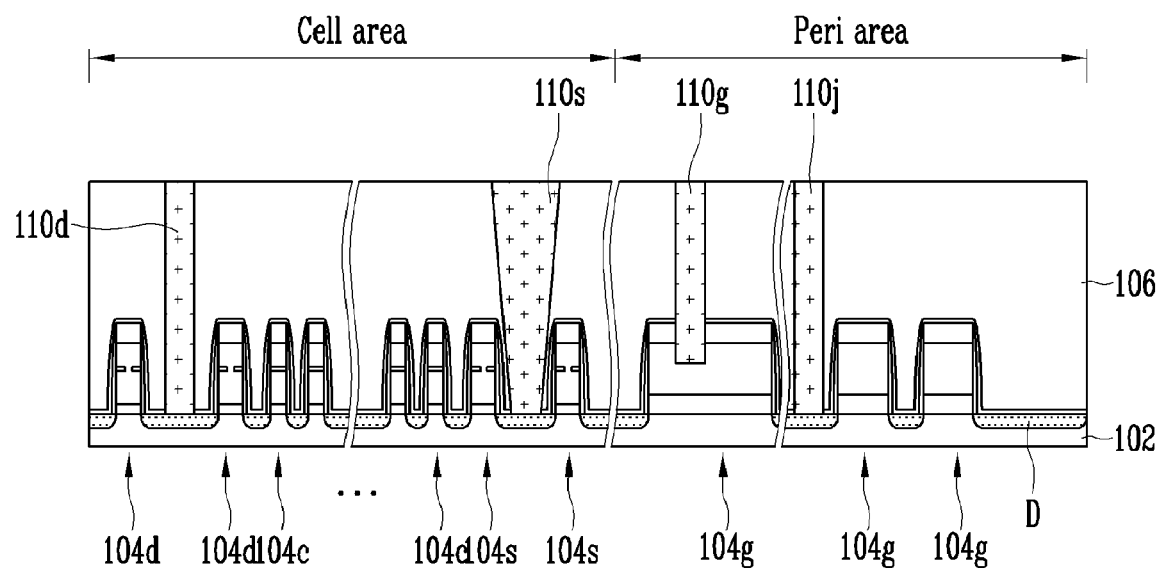
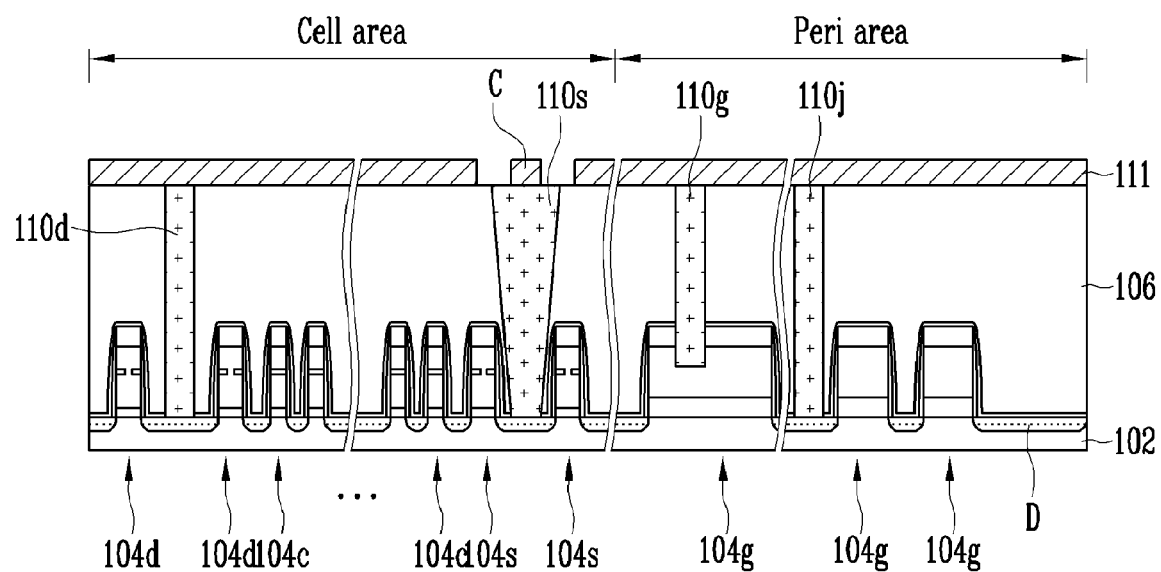

METHOD OF FORMING METAL WIRING OF NONVOLATILE MEMORY DEVICE

CROSS-REFERENCES TO RELATED APPLICATIONS

The present application claims priority to Korean patent application number 10-2008-0006150, filed on Jan. 21, 2008 and Korean patent application number 10-2008-0075700, filed on Aug. 1, 2008, which are incorporated herein by reference in its entirety.

BACKGROUND

One or more embodiments relate to a method of forming metal wirings of a nonvolatile memory device and, more particularly, to a case wherein the device is a NAND flash memory device.

A flash memory device is a highly integrated non-volatile memory device, which was developed by taking the advantages of Erasable Programmable Read Only Memory (EPROM) and Electrically Erasable Programmable Read Only Memory (EEPROM). The term 'program' refers to an operation for writing data into a memory cell, and the term 'erase' refers to an operation for erasing data written into a memory cell.

This flash memory device can be divided into two types of flash memory devices, the NOR and the NAND type, each distinguishable by the configuration and operating condition of a cell. Of them, the NAND type flash memory device enables high integration and is widely used in applications requiring high-capacity data retention.

The NAND flash memory device uses a word line, entailing a plurality of memory cell transistors connected in series between a source select line coupled to a common source line and a drain select line coupled to a bit line. A source area is formed in a semiconductor substrate between neighboring source select lines, and a drain area is formed in the semiconductor substrate between neighboring drain select lines. A plurality of peripheral transistors for applying voltage to control gate lines formed in the cell area is formed in a peripheral area of the NAND flash memory device.

The source area, the drain area and the peripheral transistors, are electrically connected to metal wirings formed on the substrate through contact plugs. However, the contact plugs, are typically formed individually through a plurality of subsequent deposition or etch processes. Accordingly, defects are likely in the process of forming the contact plugs.

Typically, a junction area and a gate line are formed by depositing a first insulating layer on a semiconductor substrate. The first insulating layer is etched, thereby forming source contact holes, thus exposing the source area. The source contact plugs are then formed by filling source contact holes with conductive materials, and performing a polishing process such as Chemical Mechanical Polishing (CMP).

Next, a second insulating layer is deposited on the first insulating layer and the source contact plugs. The first insulating layer and the second insulating layer are etched, thereby forming drain contact holes through which the drain area is exposed. The drain contact holes are filled with conductive materials, and a polishing process such as CMP is then performed, thus forming drain contact plugs.

FIG. 1 is a Scanning Electron Microscope (SEM) photograph showing defects occurring in drain contact plugs formed by known methods. As described above, a subsequent deposition and etch processes are performed to form the drain contact plugs. Accordingly, residues B can be generated between the drain contact plugs A. The residuals B can bridge neighboring drain contact plugs A, resulting in deteriorated characteristics of a semiconductor device.

BRIEF SUMMARY

One or more embodiments are directed to a method of forming metal wirings of a nonvolatile memory device, in which in forming the metal wirings (for example, bit lines) on the contact plugs (for example, source contact plugs), which cross each other in a line fashion, and an dielectric interlayer, the contact plugs and the metal wirings can be isolated from each other physically/electrically although only one dielectric interlayer is used.

One or more embodiments are directed to a method of forming metal wirings of a nonvolatile memory device, including forming a first insulating layer over a semiconductor substrate including a first junction area and a second junction area, forming first and second contact holes through which the first and second junction areas are respectively exposed in the first insulating layer, forming first and second contact plugs within the first and second contact holes, etching a part of the second contact plug, thus forming a recess, forming a second insulating layer in order to gap-fill the recess, forming a third insulating layer over the semiconductor substrate including the first and second insulating layers, forming a first trench through which the first contact plug is exposed a second trench through which the second contact plug is exposed by etching the third insulating layer, and forming first and second metal wirings within the first and second trenches, respectively.

One ore more embodiments are directed to a method of forming metal wirings of a nonvolatile memory device, including forming a first insulating layer over a semiconductor substrate including a first junction area and a second junction area, forming first and second contact holes through which the first and second junction areas are respectively exposed in the first insulating layer, forming first and second contact plugs within the first and second contact holes, etching a part of the second contact plug, thus forming a recess, forming a second insulating layer in order to gap-fill the recess, and forming a first metal wiring coupled to the first contact plug and a second metal wiring coupled to the second contact plug, over the semiconductor substrate including the first and second insulating layers.

One or more embodiments are directed to a method of forming metal wirings of a nonvolatile memory device, including forming a first insulating layer over a semiconductor substrate including a first junction area and a second junction area, forming first and second contact holes through which the first and second junction areas are respectively exposed in the first insulating layer, forming first and second contact plugs within the first and second contact holes, etching a part of the second contact plug, thus forming a recess, forming a second insulating layer over the first insulating layer in order to gap-fill the recess, forming a first trench through which the first contact plug is exposed and a second trench through which the second contact plug is exposed, by etching the second insulating layer over the first insulating layer, and forming first and second metal wirings within the first and second trenches, respectively.

One or more embodiments are directed to a method of forming metal wirings of a nonvolatile memory device, including forming a first insulating layer over a semiconductor substrate in which drain select lines, word lines, and source select lines are formed in a cell area and a transistor is formed in a peripheral area, forming first to fourth contact holes through which a first junction area between the drain select lines, a second junction area between the source select lines, a third junction area of the transistor, and a gate of the transistor are respectively exposed in the first insulating layer, forming first to fourth contact plugs within the first to fourth contact holes, respectively, forming a recess by etching a part of the second contact plug, forming a second insulating layer in order to gap-fill the recess, forming a third insulating layer over the semiconductor substrate including the first and second insulating layers, forming first to fourth trenches through which the first to fourth contact plugs are respectively exposed by etching the third insulating layer, and forming first to fourth metal wirings within the first to fourth trenches, respectively.

One or more embodiments are directed to a method of forming metal wirings of a nonvolatile memory device, including forming a first insulating layer over a semiconductor substrate in which drain select lines, word lines, and source select lines are formed in a cell area and a transistor is formed in a peripheral area, forming first to fourth contact holes through which a first junction area between the drain select lines, a second junction area between the source select lines, a third junction area of the transistor, and a gate of the transistor are respectively exposed in the first insulating layer, forming first to fourth contact plugs within the first to fourth contact holes, respectively, forming a recess by etching a part of the second contact plug, forming a second insulating layer in order to gap-fill the recess, and forming first to fourth metal wirings, each coupled to the first to fourth contact plugs, over the semiconductor substrate including the first and second insulating layers.

One or more embodiments are directed to a method of forming metal wirings of a nonvolatile memory device, including forming a first insulating layer over a semiconductor substrate in which drain select lines, word lines, and source select lines are formed in a cell area and a transistor is formed in a peripheral area, forming first to fourth contact holes through which a first junction area between the drain select lines, a second junction area between the source select lines, a third junction area of the transistor, and a gate of the transistor are respectively exposed in the first insulating layer, forming first to fourth contact plugs within the first to fourth contact holes, respectively, forming a recess by etching a part of the second contact plug, forming a second insulating layer over the first insulating layer in order to gap-fill the recess, forming first to fourth trenches through which the first to fourth contact plugs are respectively exposed, by etching the second insulating layer over the first insulating layer, and forming first to fourth metal wirings within the first to fourth trenches, respectively.

In the above embodiments, an etch-stop layer may be formed before the insulating layer is formed, and may be etched after the insulating layer is etched.

In the above embodiments when the first trench extends across an area where the second contact plug is formed, the first contact plug and the remaining insulating layer may be exposed through the first trench.

In the above embodiments, when the first metal wiring extends across an area where the second contact plug is formed, the second insulating layer may isolate the first metal wiring.

In the above embodiments, the second contact plugs may be formed in a line fashion, electrically connecting the second junction areas.

In the above embodiments, the recess may be formed by etching a central portion of the second contact plug. The edge portions of the second contact plug may be exposed in different second trenches, respectively. Second metal wirings may be formed in the second trenches, respectively.

In the above embodiments, the recess may be formed by etching a central region of the second contact plug, and upper portions of both edge portions of the second contact plug may connect to different second metal wirings.

In the above embodiments, the recess may be formed by etching an upper central region of and an upper portion of the second contact plug. The second trench may be formed exposing the other edge portion of the second contact plug.

In the above embodiments, the recess may be formed by etching an upper central region of one edge portion of the second contact plug. The second metal wiring may connect to an upper portion of the other edge portion of the second contact plug.

In the above embodiments, the formation of the second insulating layer is formed over the semiconductor substrate, filling the recess. The second insulating layer is then etched so that only the recess remains filled. An etch-stop layer may be on a surface of the first insulating layer including the recess before the formation of the second insulating layer.

In the above embodiments, the first metal wirings, are connected to the different junction areas, and may be arranged in parallel between the second metal wirings. 100 to 2000 first metal wirings may be isolated from the second contact plugs.

In the above embodiments, a well pickup plug connected to a well formed in the semiconductor substrate may be formed between different second contact plugs. A well pickup line connected to the well pickup plug may be formed between the second metal wirings.

BRIEF DESCRIPTION OF THE DRAWINGS

FIGS. 2A to 2H are diagrams showing a method of forming metal wirings of a nonvolatile memory device of one embodiment;

DESCRIPTION OF EMBODIMENTS

Figure 1:
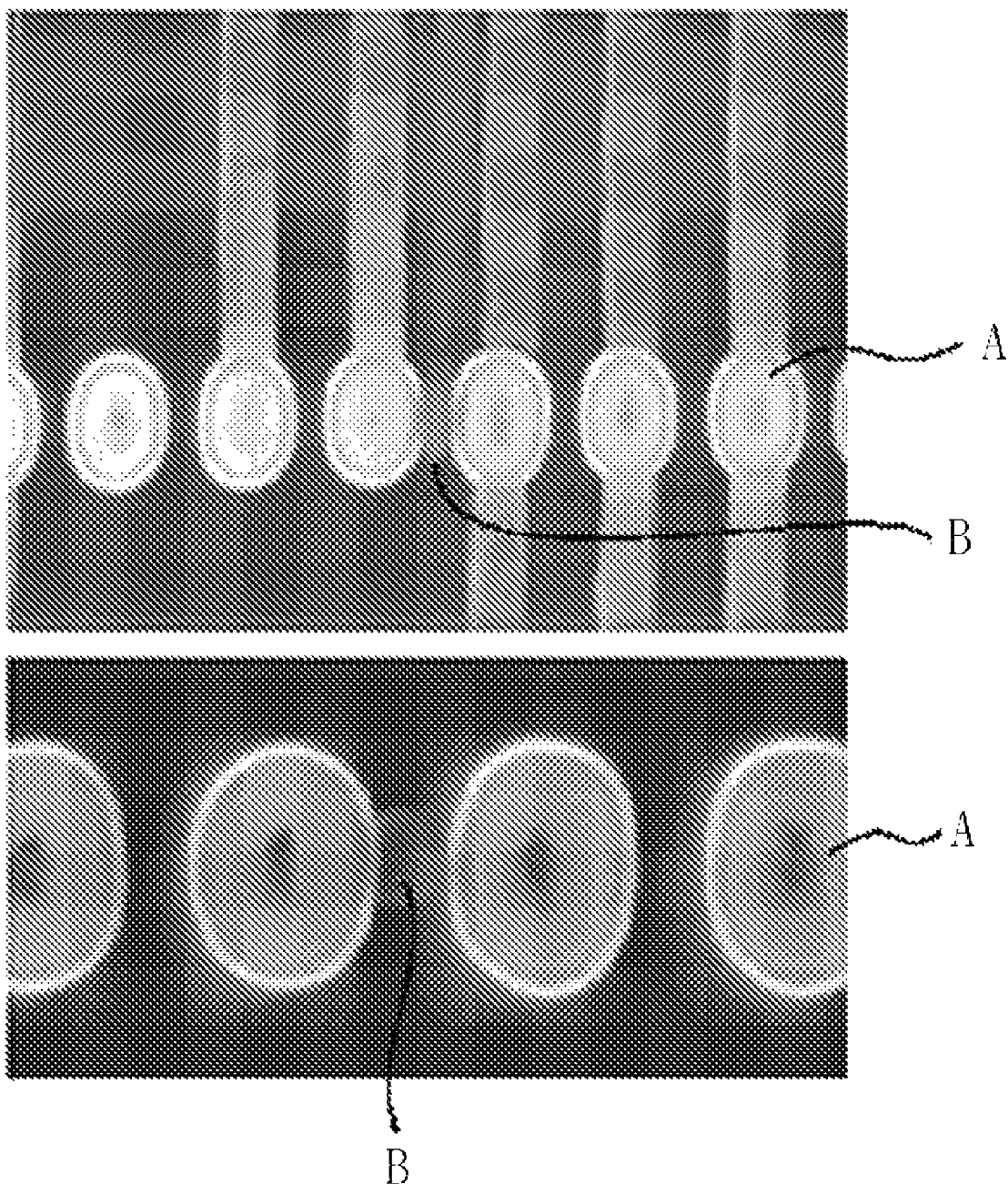
FIG. 1 is a SEM photograph showing defects in drain contact plugs formed by known methods.

Hereinafter, the present disclosure will be described in detail in connection with one or more embodiments with reference to the accompanying drawings. The figures are provided to allow those having ordinary skill in the art to understand the scope of one or more embodiments of the disclosure. To clarify multiple layers and regions, the thickness of the layers is enlarged in the drawings.

Figure 2A:
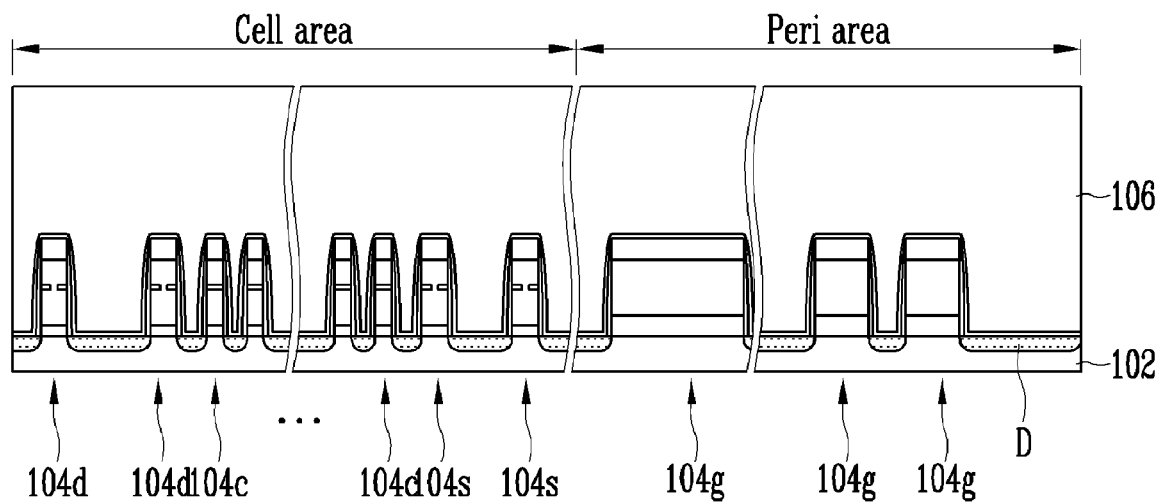

FIGS. 2A to 2H are diagrams showing a method of forming metal wirings of a nonvolatile memory device of one embodiment. Referring to FIG. 2A, a plurality of word lines 104c is formed between drain select lines 104d and source select lines 104s in a cell area of a semiconductor substrate 102, and a plurality of gates 104g is formed in a peripheral area of the semiconductor substrate 102.

Although not shown in the drawings, the drain select lines 104d or the source select lines 104s are formed by gates of a plurality of select transistors electrically connected to each other. The word lines 104c are formed by gates of a plurality of memory cell transistors electrically connected to each other. The drain select lines 104d, the source select lines 104s, and the word lines 104c are formed, including a gate insulating layer, a floating gate, a dielectric layer, and a control gate. The floating gate and the control gate of the drain select line 104d, the source select line 104s, and the word lines 104c are electrically connected to each other.

Meanwhile, junction areas D are formed in the semiconductor substrate 102 between the drain select lines 104d, the source select lines 104s, the word lines 104c and the gates 104g. The junction area D between the source select lines 104s is a source area, and the junction area D between the drain select lines 104d is a drain area. Although not shown in the drawings, the drain area and the source area can be formed by a plurality of drain areas and source areas isolated from each other and arranged in a row or a single line fashion.

A spacer is formed on the side of each of the drain select line 104d, the source select line 104s, the word lines 104c, and the gate 104g. A passivation layer, such as a Self-Aligned Contact (SAC) nitride layer, is formed on the spacer for protecting the sides of gate lines during subsequent contact hole formation processes. An insulating layer 106 is then formed over the semiconductor substrate 102.

Figure 2B:
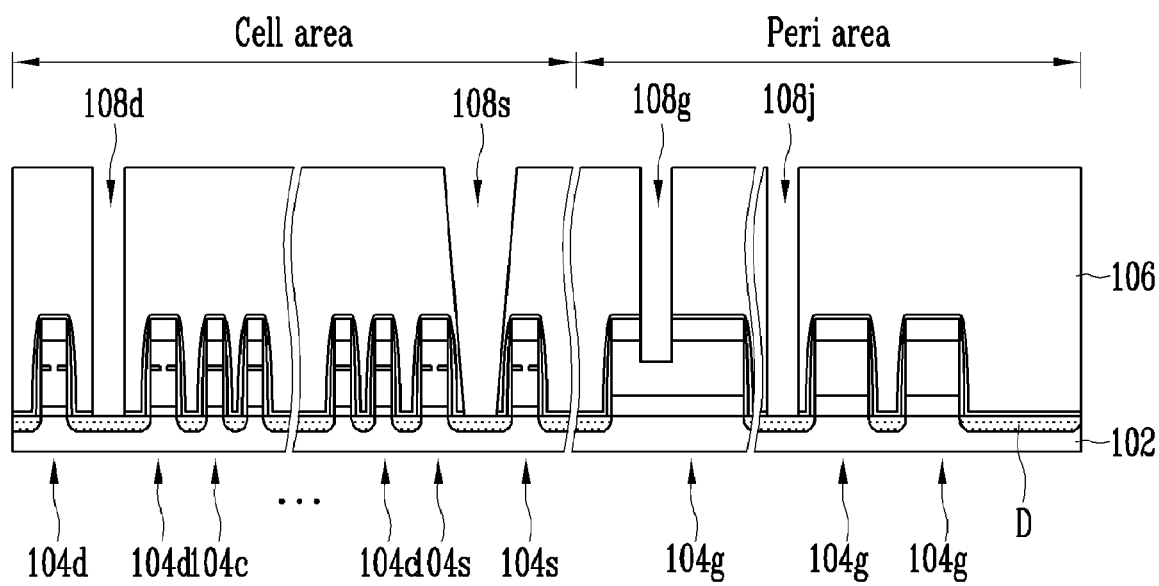

Referring to FIG. 2B, the first, second, third, and fourth contact holds 108s, 108d, 108g and 108j are formed by etching the insulating layer 106. The first contact holes 108s are formed on the source area in a line fashion, although not shown in the drawings. The second contact holes 108d are formed on the drain area, isolated from each other in a line fashion, although not shown in the drawings. The third contact holes 108g are formed on the gates 104g, and the fourth contact holes 108j are formed on the junction area D of the gates 104g.

Referring to FIG. 2C, on the insulating layer 106, a conductive material is formed filling the first through fourth contact holes 108s-108j. The conductive material may include any combination of tungsten (W), $TiSi_x$, TiN, Cu, and Al, which are formed by Chemical Vapor Deposition (CVD). A diffusion-prevention layer of a Ti/Tin or WN formed by Physical Vapor Deposition (PVD) or CVD may be formed under the conductive material.

The conductive material is then polished by CMP or the like, so that the conductive material remains in the first through fourth contact holes 108s-108j. Thus, a plurality of first, second, third, and fourth contact plugs 110s, 110d, 110g, and 110j are formed in the insulating layer 106 in line with the shape of the contact holes at the same time. Here, the first contact plugs 110s are connected to the source area, the second contact plug 110d is connected to the drain area, the third contact plug 110g is connected to upper portions of the gates 104g, and the fourth contact plug 110j is connected to the junction area of the gates 104g. Thus, although not shown in the drawings, the first contact plugs 110s are formed in a line fashion, and the second contact plug 110d includes a plurality of second contact plugs 110d isolated from each other and arranged in a row.

In known methods of fabrication, the drain contact plugs and the contact plugs of the peripheral area were formed after the source contact plugs.

As described above, when the source contact plugs and other contact plugs are formed separately, additional processes, such as formation of the contact plugs, an alignment for contact hole etching, mask pattern formation, a contact hole etching, etc., are necessary. Accordingly, defects, such as residues or alignment, may occur, the turnaround time may be longer, and the costs may increase.

However, in one or more embodiments, contact plugs including the source contact plugs are all formed at once. Accordingly, fewer fabrication processes steps are necessary, defects can be decreased significantly, the turnaround time can be shortened, and the costs can be lowered.

Referring to FIG. 2D, a mask layer 111 is formed exposing a top surface of the first contact plugs 110s. More specifically, the mask layer 111 is formed over all the contact plugs, but the top surface of the first contact plugs 110s is partially opened by etching. The mask layer 111 is formed such that a part (indicated by 'C') where a metal wiring (for example, a common source line) connects to the first contact plugs 110s, on the top surface of the first contact plugs 110s, is not opened.

This area is formed in a direction intersecting the word lines 104c formed in the semiconductor substrate 102 and is formed between second areas where metal wirings (for example, bit lines) connect to the second contact plugs 110d. A process of forming the metal wirings will be described later.

Figure 2E:
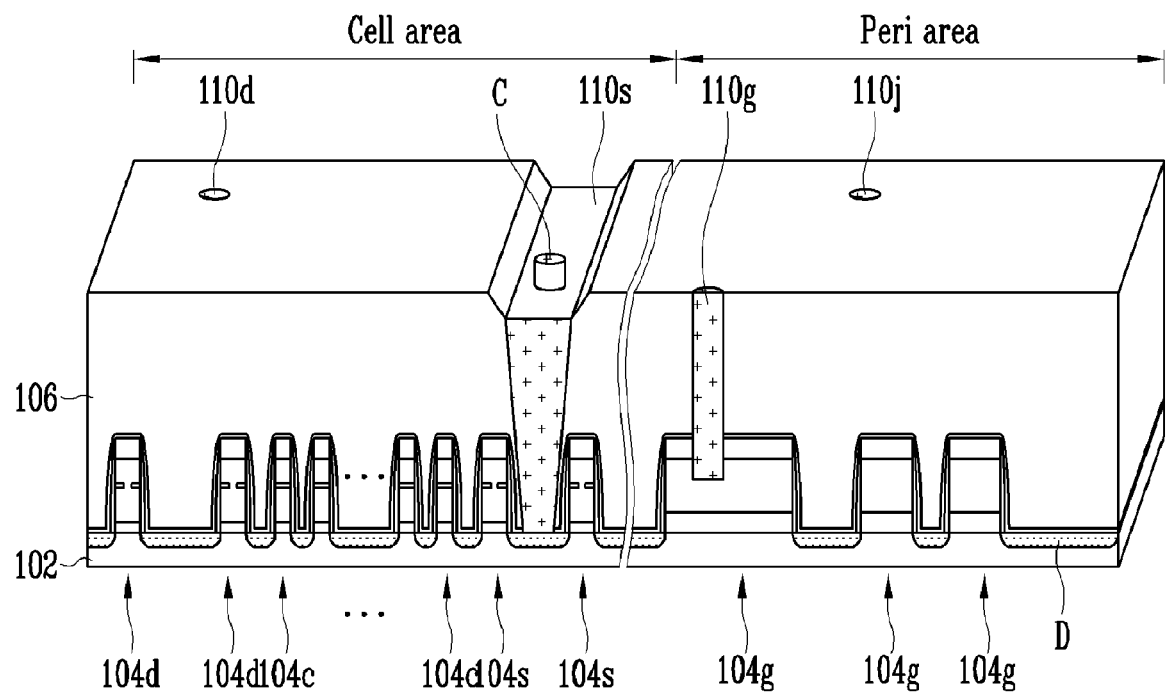

Referring to FIG. 2E, the height of the exposed part of the top surface of the first contact plugs 110s is layered by etching the mask layer 111. The lowered height of the first contact plugs 110s may range from 1000 to 3000 angstroms. Herein, part C of the top surface of the first contact plug 110s of the area through which the common source line passes, is not etched forming a protruding portion. A height of the protruding portion may range from 1000 to 3000 angstrom. The mask layer 111 is then removed.

Figure 2F:
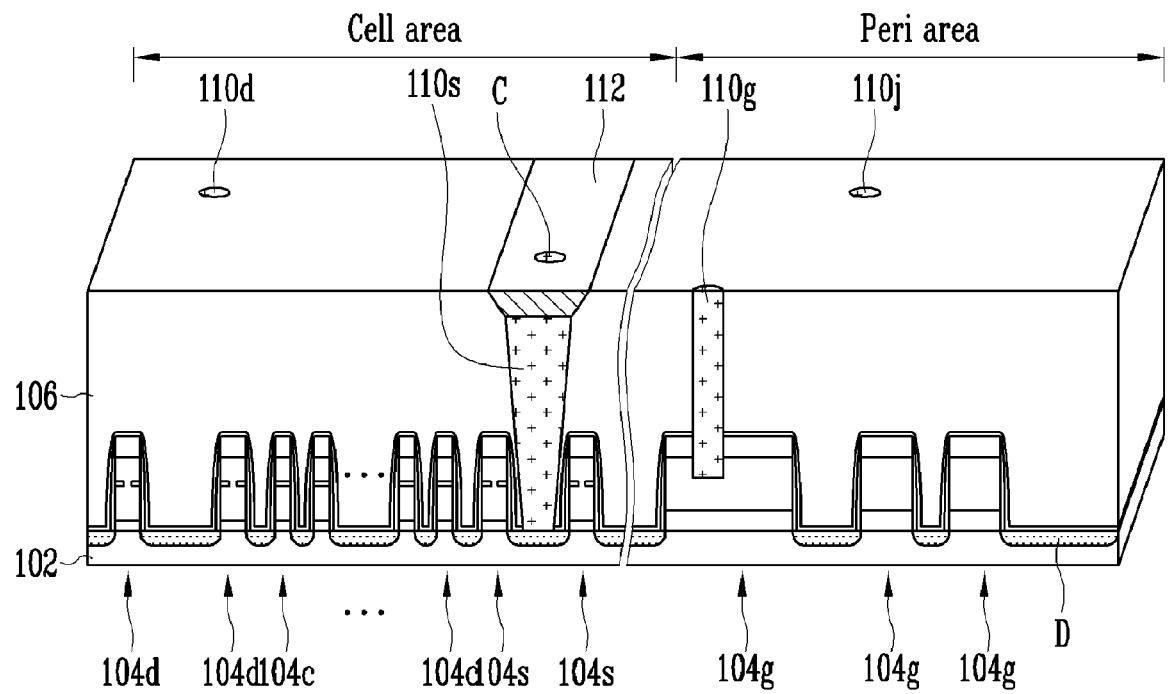

Referring to FIG. 2F, insulating material is formed on the etched portion the insulating layer 106, by filling the gap on the top surface of the first contact plugs 110s. An insulating portion 112 is formed through a polishing process, such as CMP, or an etch-back process on the insulating material formed on the insulating layer 106. Here, the protruding portion C of the first contact plugs 110s is exposed upwardly from the insulating portion 112. In view of the first contact plugs 110s formed in a linear fashion, bit lines and the first contact plugs 110s may be disconnected from each other at a portion where the second areas in which the metal wirings (for example, bit lines) other than the common source line are formed are overlapped with the top surface of the first contact plugs 110s. Accordingly, the insulating portion 112 insulates the top surface of the first contact plugs 110s other than the protruding portion C, thus preventing such disconnection.

Figure 2G:
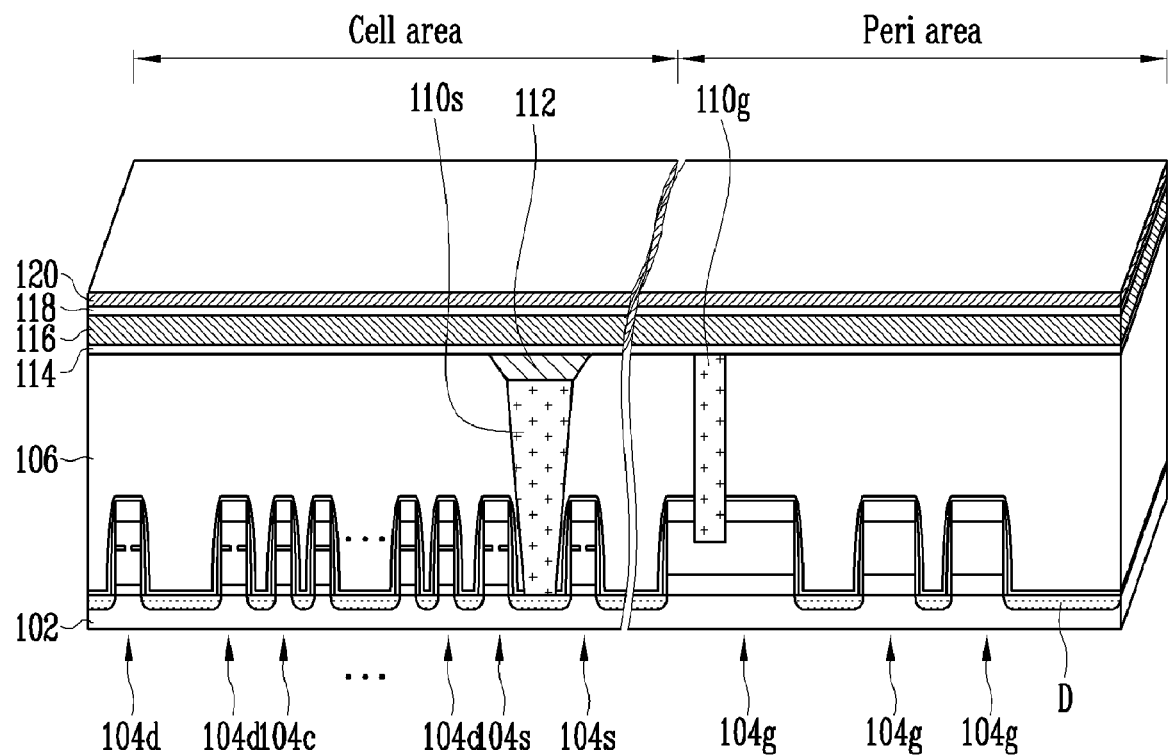

Referring to FIG. 2G, a process for forming metal wirings connected to the first contact plugs 110s and the fourth contact plug 110j is described as one embodiment. The metal wirings are formed using a Reactive Ion Etching (RIE) method. First, a stack comprising a diffusion-prevention layer 114, a metal layer 116, a hard mask layer 118 and a conductive layer 120 is formed on the insulating layer 106.

Figure 2H:
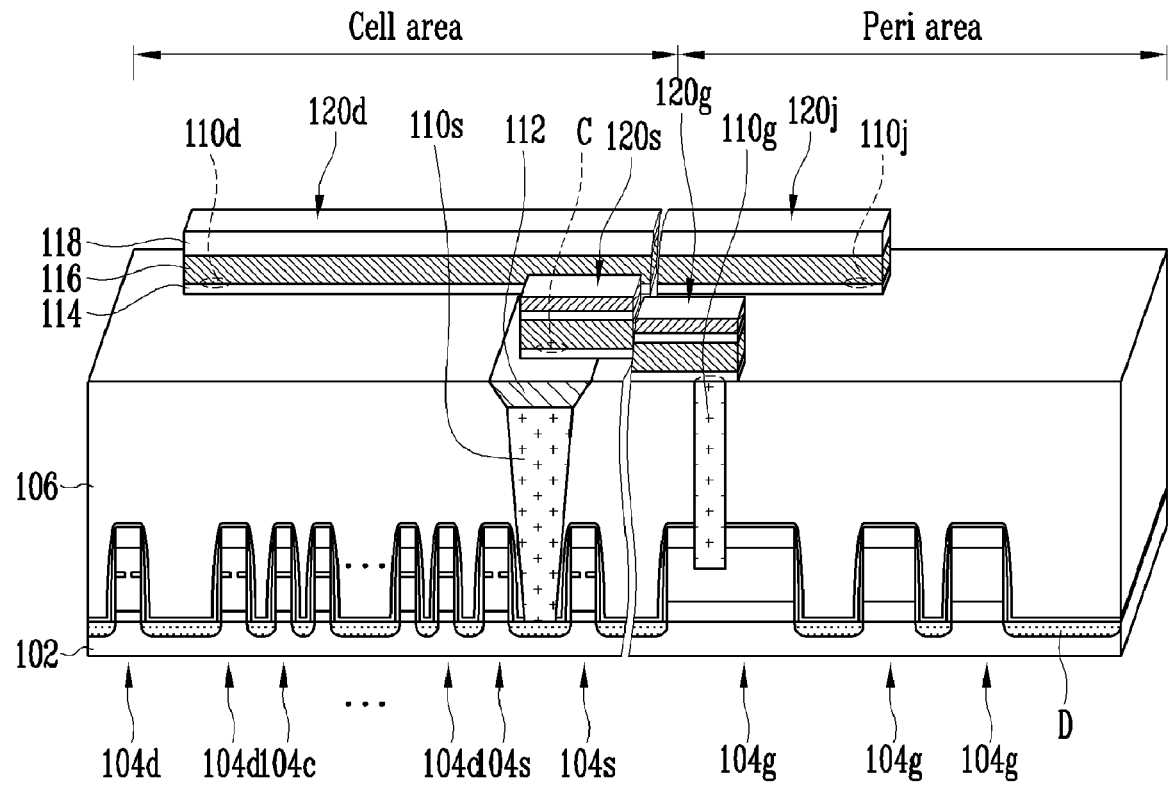

Referring to FIG. 2H, a first metal wiring 120s and a second metal wiring 120d are formed in the first area and the second area of the cell area, respectively, and a third metal wiring 120g and a fourth metal wiring 120j are formed in the peripheral area, are patterned using a RIE method employing the hard mask layer 118. The first metal wiring 120s is connected to the first contact plugs 110s via the protruding portion C and then to the underlying source area, and may become, for example, a common source line. The second metal wiring 120d is connected to the second contact plug 110d and then to the underlying drain area, and may become, for example, a bit line. The third metal wiring 120g is connected to the third contact plug 110g and then to the underlying gate 104g. The fourth metal wiring 120j is connected to the fourth contact plug 120g and then to the underlying junction area D.

Figure 3A:
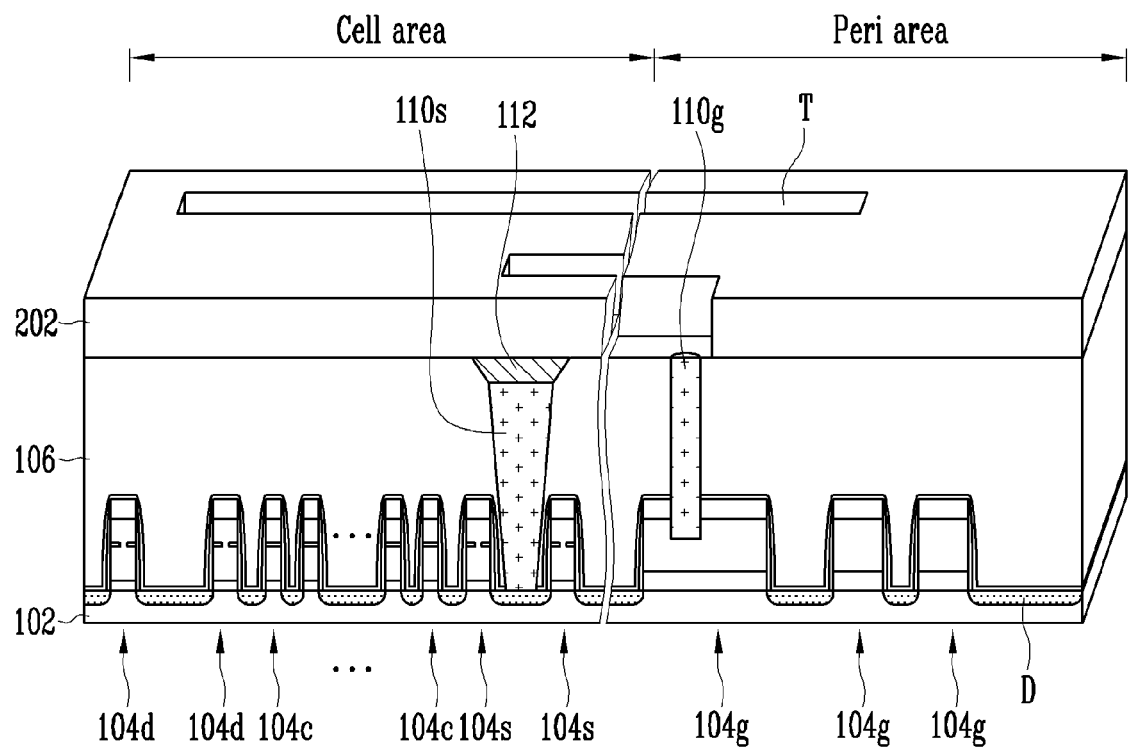
FIGS. 3A and 3B are diagrams showing a method of forming metal wirings of a nonvolatile memory of another embodiment.
Figure 3B:
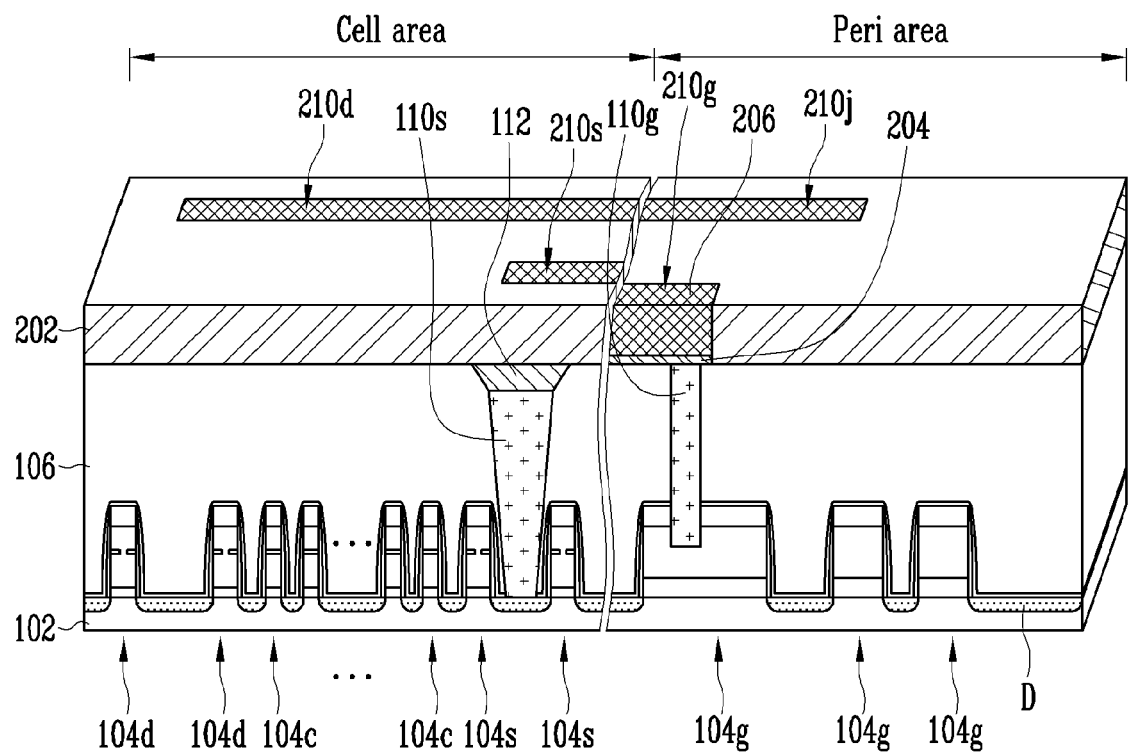

Meanwhile, FIGS. 3A and 3B are diagrams showing a method of forming metal wirings of a nonvolatile memory device of another embodiment.

FIG. 3A, describes a damascene method of forming the metal wirings, performed after the step of FIG. 2F, a trench dielectric layer 202 is formed on the insulating layer 106. A trench T is etched in an area where the metal wirings to be connected to the first contact plugs 110s and the fourth contact plug 110j are formed.

Referring to FIG. 3B, a diffusion-prevention layer 204 is formed under the trench. A metal layer 206 is formed in the trenches T of the trench dielectric layer 202. A first metal wiring 210s and a second metal wiring 210d are formed in the first and second areas of the cell area, respectively, and a third metal wiring 210g and a fourth metal wiring 210j are formed in the peripheral area in the trench, by performing a polishing process or an etch-back process on the metal layer 206 on the trench dielectric layer 202. The first metal wiring 210s is connected to the first contact plugs 110s via the protruding portion C and then connected to the underlying source area. For example, the first metal wiring 210s may become a common source line. The second metal wiring 210d is connected to the second contact plug 110d and then to the underlying drain area. For example, the second metal wiring 210d may become a bit line. The third metal wiring 210g is connected to the third contact plug 110g and then to the underlying gate 104g. The fourth metal wiring 210j is connected to the fourth contact plug 120g and then to the underlying junction area D.

FIGS. 4A to 4E are plan views showing a method of forming metal wirings of a nonvolatile memory device of yet another embodiment. FIGS. 5A to 5F are sectional views showing a method of forming metal wirings of a nonvolatile memory device of the embodiment.

Figure 5A:
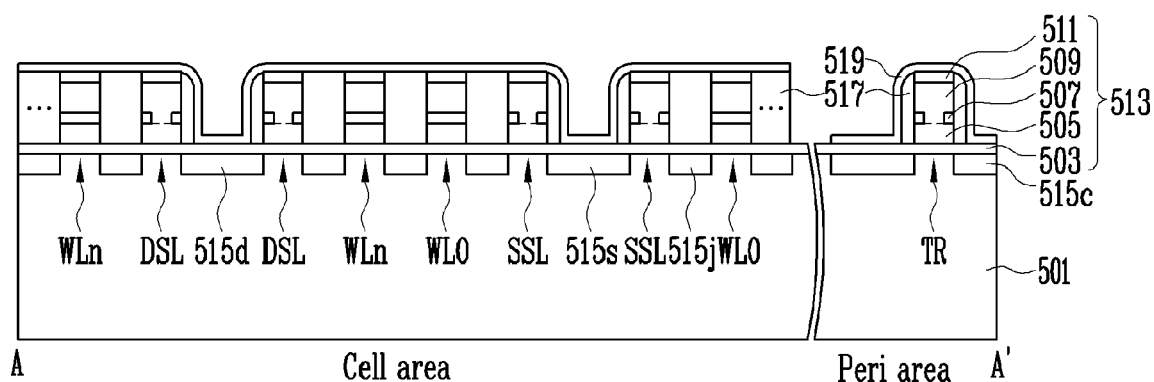
FIGS. 5A to 5F are sectional views showing a method of forming metal wirings of a nonvolatile memory device of yet another embodiment.

Referring to FIG. 5A, a semiconductor substrate 501 includes a cell area and a peripheral area. Word lines WL0 to WLn, and select lines (drain select transistors and source select transistors) DSL, SSL are formed in a cell area. Elements (for example, transistors TR) for generating voltages necessary for program/erase/read operations or applying the voltages to the cell area are formed in the peripheral area. This is described in more detail, hereafter.

The word lines WL0 to WLn and the select lines DSL and SSL, including a gate insulating layer 503, a floating gate 505, a dielectric layer 507, a control gate 509, and a hard mask 511, are formed in the cell area. 16, 32, 64 or more word lines WL0 to WLn may be formed between the drain select line DSL and the source select line SSL. Junction areas 515j, 515s, 515d are formed in a semiconductor substrate 501 between the word lines WL0 to WLn and the select lines DSL and SSL. The junction area between the drain select lines DSL becomes a drain 515d, and the junction area between the source select lines SSL becomes a source 515s. An insulating layer 517 is filled between the word lines WL0 to WLn. A spacer 517 is formed from an insulating layer on sidewalls of the select lines DSL and SSL, which face each other.

A gate, including the gate insulating layer 503, the floating gate 505, the dielectric layer 507, the control gate 509, and the hard mask 511, and a transistor TR, including junction areas 515c formed in the semiconductor substrate 501 at the edges of the gate, are formed in a peripheral area. The spacer 517 is formed from an insulating layer on the sidewalls of the gate.

Meanwhile, contact holes are formed in the select lines DSL, SSL of the cell area and the dielectric layer 507 included in the gate of the peripheral area, thus, the control gate 509 and the floating gate 505 can be electrically connected to each other.

The word lines WL0 to WLn and the select lines DSL and SSL of the cell area and the gate of the peripheral area are formed at the same time using the same process. Thereafter, a SAC nitride layer 519 is formed on the entire surface of the semiconductor substrate 501.

Figure 4A:
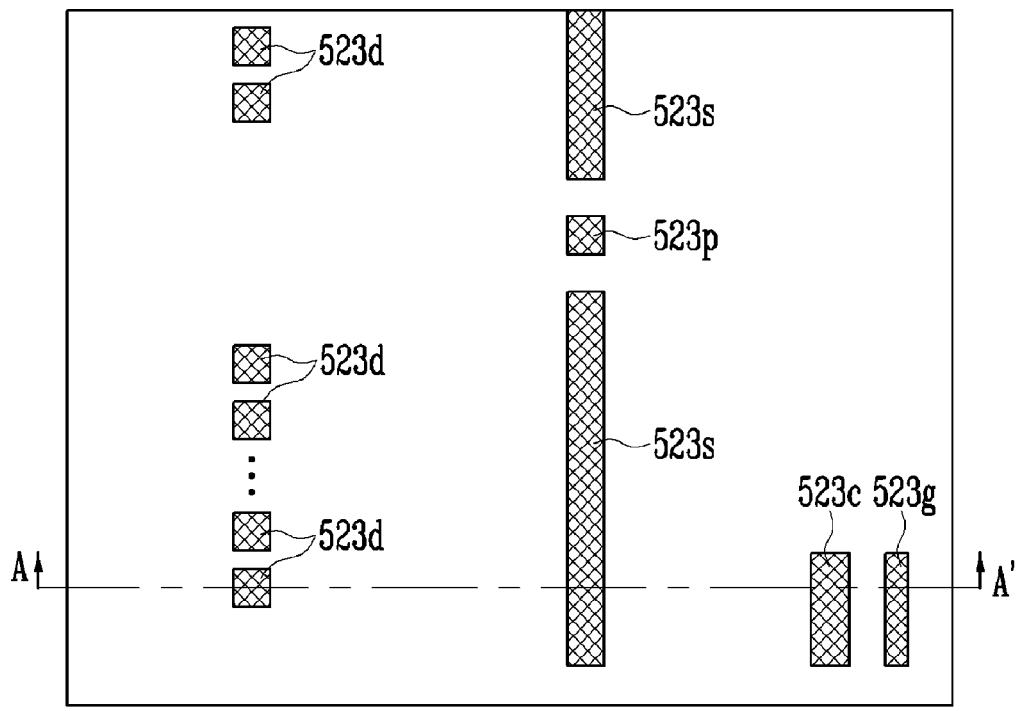
FIGS. 4A to 4E are plan views showing a method of forming metal wirings of a nonvolatile memory device of yet another embodiment.
Figure 5B:
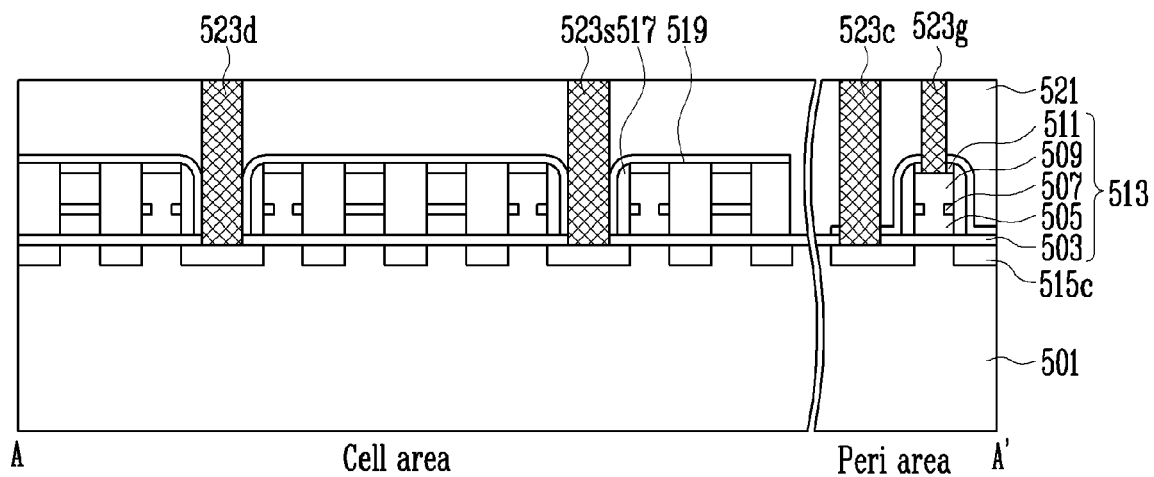

Referring to FIGS. 4A and 5B, a first dielectric interlayer 521 is formed over the semiconductor substrate 501. After contact holes are formed in the first dielectric interlayer 521, contact plugs 523d, 523s, 523c, and 523g are formed within the contact holes, respectively. For example, between the drain select lines DSL of the cell area, after a contact hole is etched into the first dielectric interlayer 521, the SAC nitride layer 519, and the gate insulating layer 503 thereby, exposing the drain 515d, the drain contact plugs 523d can be formed within the contact hole. Further, between the source select lines SSL of the cell area, after contact holes are etched into the first dielectric interlayer 521, the SAC nitride layer 519, and the gate insulating layer 503 thereby exposing the source 515s, the source contact plugs 523s can be formed within the contact holes. In the peripheral area, after a contact hole is etched into the first dielectric interlayer 521, the SAC nitride layer 519, and the gate insulating layer 503 thereby exposing the junction area 515c, the junction plug 523c can be formed within the contact hole. Furthermore, after contact holes are etched into the first dielectric interlayer 521, the SAC nitride layer 519, and the hard mask 511 thereby exposing a conductive layer for the control gate 509 of the gate 513 included in the transistor TR, the gate contact plug 523g can be formed within the contact holes. The contact plugs 523d, 523s, 523c, and 523g are formed at the same time using the same process.

Meanwhile, the drain contact plugs 523d are formed on every top surface of the plurality of drains 515d. The plurality of drains are formed in a row between the drain select lines DSL and are isolated from each other by isolation layers (not shown). The source contact plugs 523s are formed in a line fashion between the source select lines SSL and electrically connect to the sources 515s. The sources 515s which are formed between the source select lines SSL and are isolated from each other by isolation layers (not shown). One source select line SSL can electrically connect 100 to 2000 sources 515s, at the top surfaces.

The source contact plugs 523s are also formed in a row between the source select lines SSL in the same manner as the drain contact plugs 523d. Well pickup plugs 523p for transferring a specific voltage (for example, an erase voltage) to a P well (not shown) of the semiconductor substrate 501 may be formed between the source contact plugs 523s.

Only one first dielectric interlayer 521 is etched to form the contact holes for the plugs 523d, 523s, 523c, 523g, and 523P, thus, a target etch thickness can be lowered. This ensures the dielectric interlayer is fully etched can be exposing the junction area. Furthermore, the gap-filling characteristic of conductive material for the plugs can be improved.

Figure 4B:
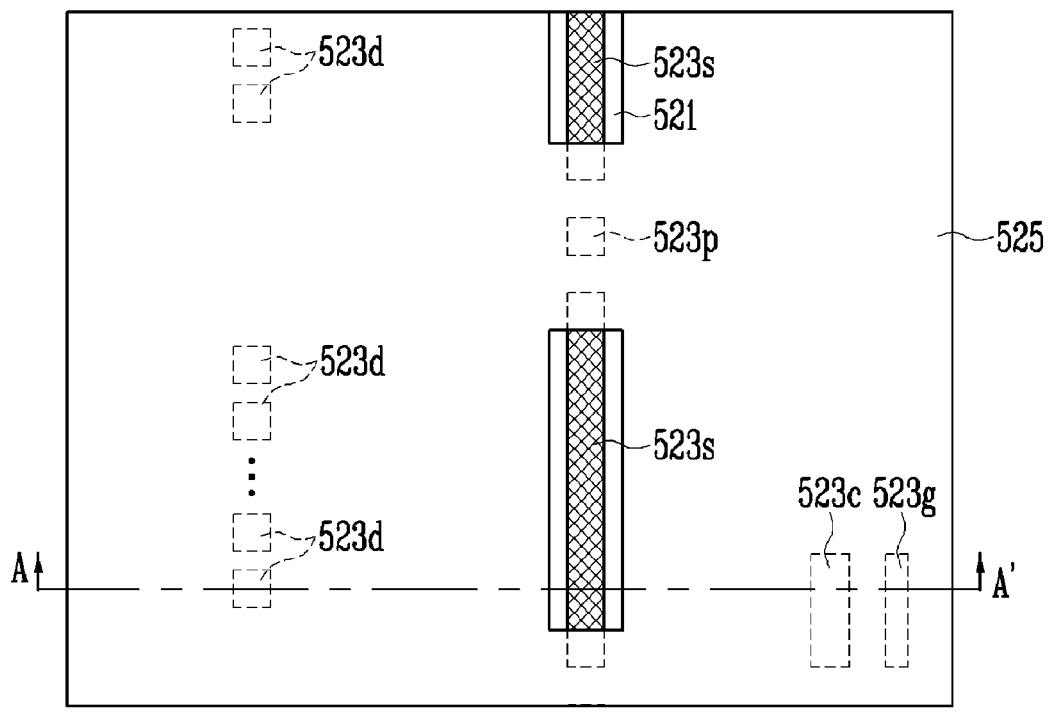
Figure 5C:
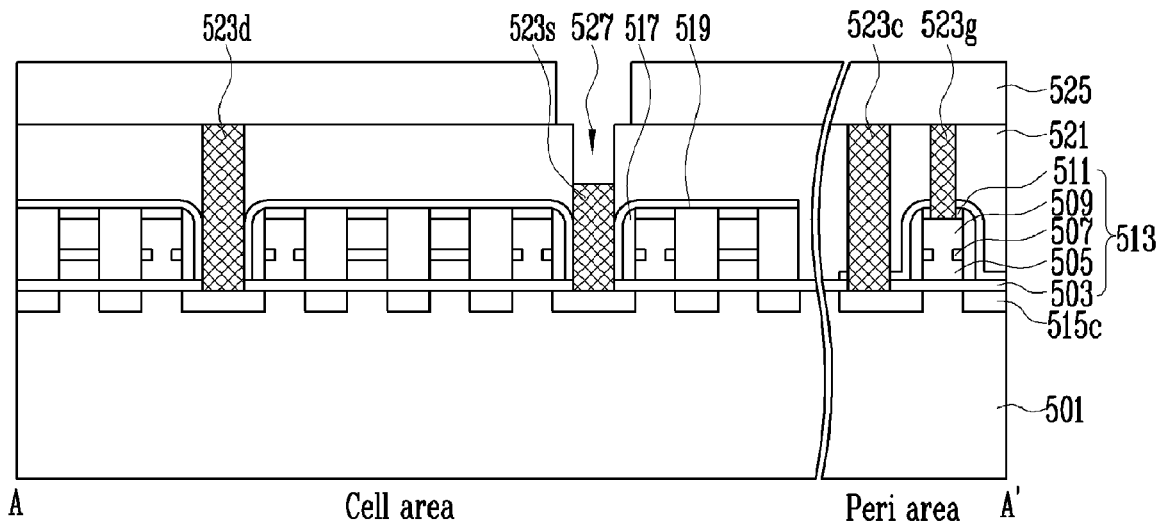

Referring to FIGS. 4B and 5C, an etch mask 525 through which parts of the source contact plugs 523s are exposed is formed on the first dielectric interlayer 521. For example, the etch mask 525 can be formed exposing one or both edge portions of the source contact plug 523s. At this time, the etch mask 525 may be formed with an opening having an area wider than the width of the source contact plug 523s. Accordingly, a part of the first dielectric interlayer 521 adjacent to the source contact plugs 523s is exposed.

Next, the exposed top surfaces of the source contact plugs 523 are etched. Thus, a recess 527 is formed at a central portion of the source contact plugs 523s. Alternatively, the source contact plugs 523s may be etched such that the edge portions of one side of the source contact plugs 523s are higher than those of the other side thereof. The higher portion of the source contact plugs 523s has the same height as that of a surface of the first dielectric interlayer 521. Here, the recess 527 may be formed on the edge portions of one or both sides of the source contact plugs 523s.

Figure 4C:
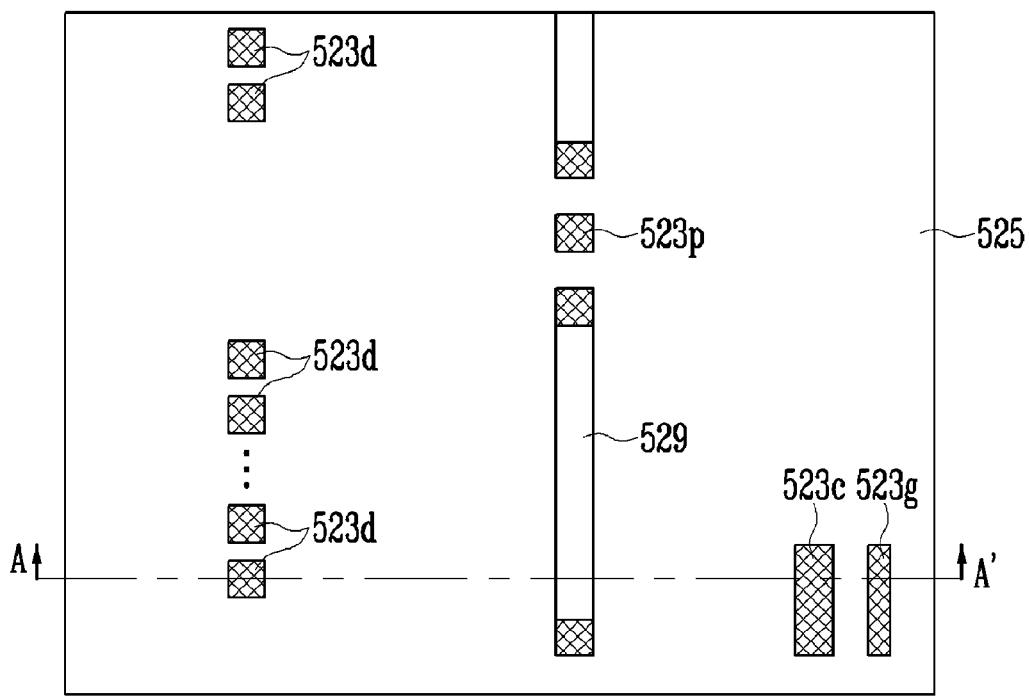
Figure 5D:
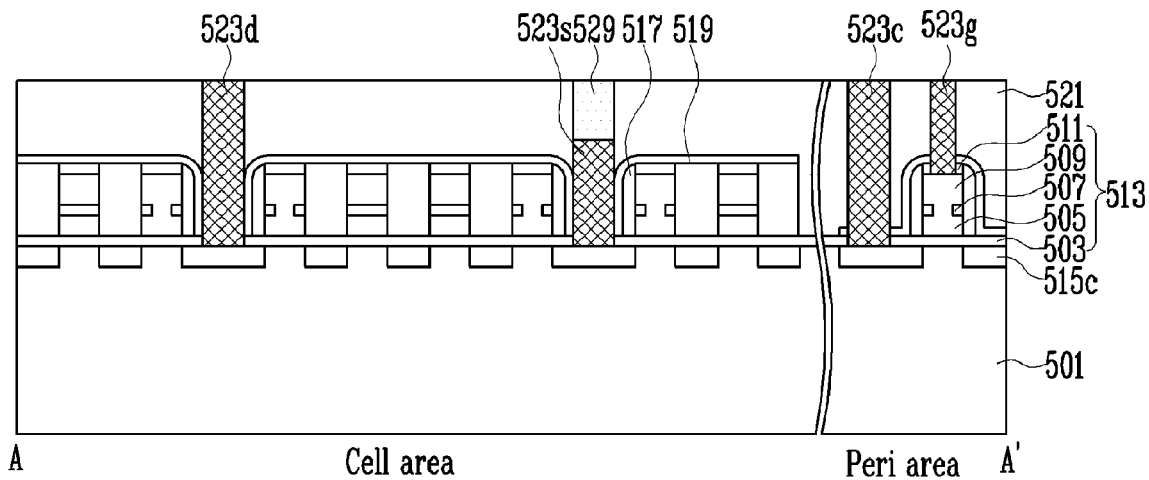

Referring to FIGS. 4C and 5D, after the etch mask is removed, an insulating layer 529 is formed in the recess 527 over the source contact plugs 523s. The insulating layer 529 may be formed from an oxide layer, a nitride layer or a mixed layer thereof. After the insulating layer 529 is formed filling the recess 527, the insulating layer 529 is polished so that the only remaining portions are the recess 527. Alternatively, after the insulating layer 529 is formed filling the recess the first dielectric interlayer is exposed by a polishing process before the etch mask is removed Thus, only an upper surface of edge portions of one or both sides of the source contact plugs 523s is exposed. Here, when the exposed portions of the source contact plugs 523s extend toward the region where the source contact plugs 523s are formed, it is important to control the length and exposed area of the source contact plugs 523s so that the source contact plugs 523s do not intersect the drain contact plugs 523d.

Figure 4D:
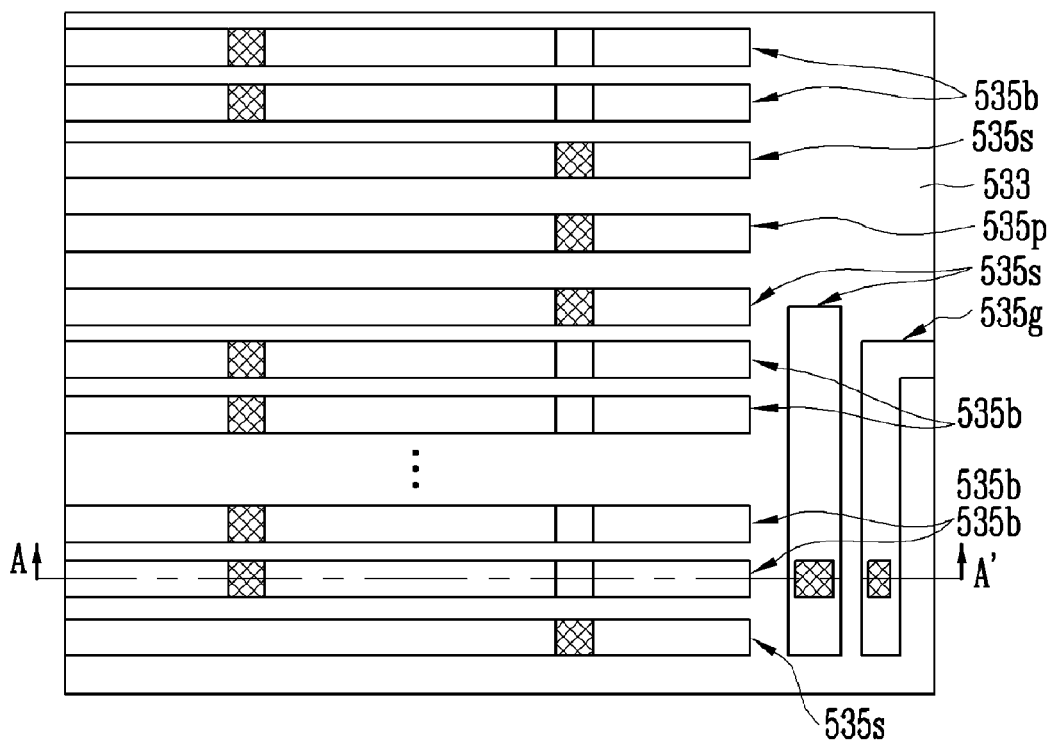
Figure 5E:
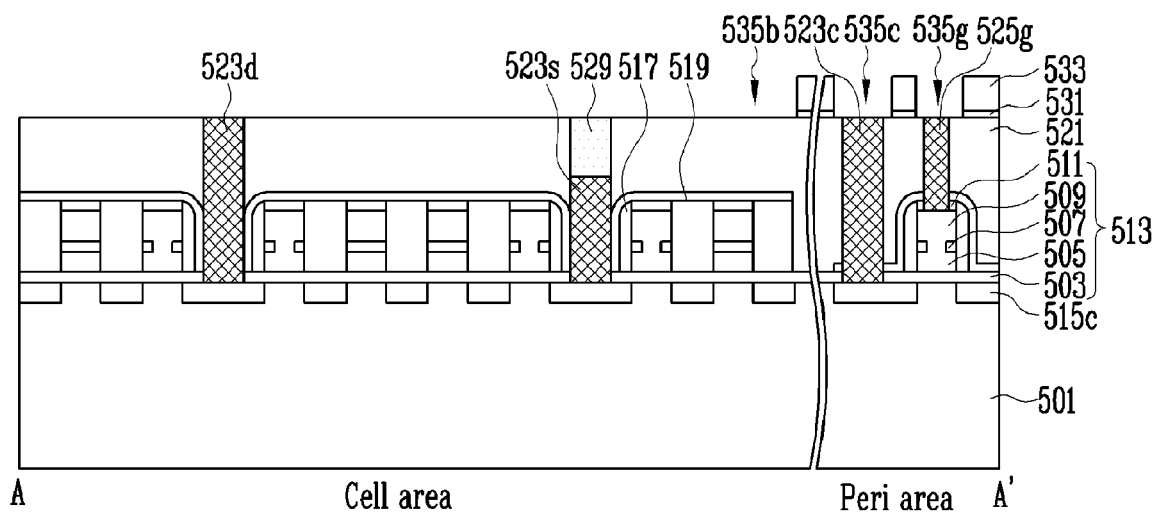

Referring to FIGS. 4D and 5E, a second dielectric interlayer 533 is formed over the semiconductor substrate 501 including the insulating layer 529. An etch-stop layer 531 may be formed before the second dielectric interlayer 533 is formed. The exposed etch-stop layer 521 is etched after the second dielectric interlayer 533 is etched, thereby forming damascene patterns 535s, 535b, 535p, 535c, and 535g.

The first damascene patterns 535b are formed defining areas where bit lines will be formed and to expose the drain contact plugs 523d, respectively. The first damascene patterns 535b are formed in parallel and extending in a first direction that intersects a second direction where the drain contact plugs 523d are arranged. Here, the first damascene patterns 535b extend intersecting areas where the source contact plugs 523s are formed. However, the insulating layer 529 is formed over the source contact plugs 523s in the areas where the first damascene patterns 535b intersect the source contact plugs 523s. Thus, both the source contact plugs 523s, and the insulating layer 529 are exposed through the first damascene patterns 535b.

The second damascene patterns 535s are formed defining areas where source lines will be formed and to expose the edge portions of one or both sides of the source contact plugs 523s, respectively. The second damascene patterns 535s are formed in parallel and extending in a first direction that intersects the second direction where the source contact plugs 523s. At this time, the drain contact plugs 523d should be exposed by the second damascene patterns 535s. Accordingly, when the exposed portions of the source contact plugs 523s extend towards to the region where the source contact plugs 523s are formed in FIG. 4C, it is important to control the length and exposed area of the source contact plugs 523s such that the source contact plugs 523s do not intersect the drain contact plugs 523d. Meanwhile, 100 to 2000 first damascene patterns 535b may be formed between the second damascene patterns 535s.

The third damascene patterns 535p are formed defining areas where well pickup lines will be formed and to expose the well pickup plugs 523p. The third damascene patterns 535p are formed parallel to the second damascene patterns 535s.

Meanwhile, the fourth and fifth damascene patterns 535c and 535g through which the junction plug 523c and the gate plug 523g are respectively exposed are formed in the peripheral area.

Figure 4E:
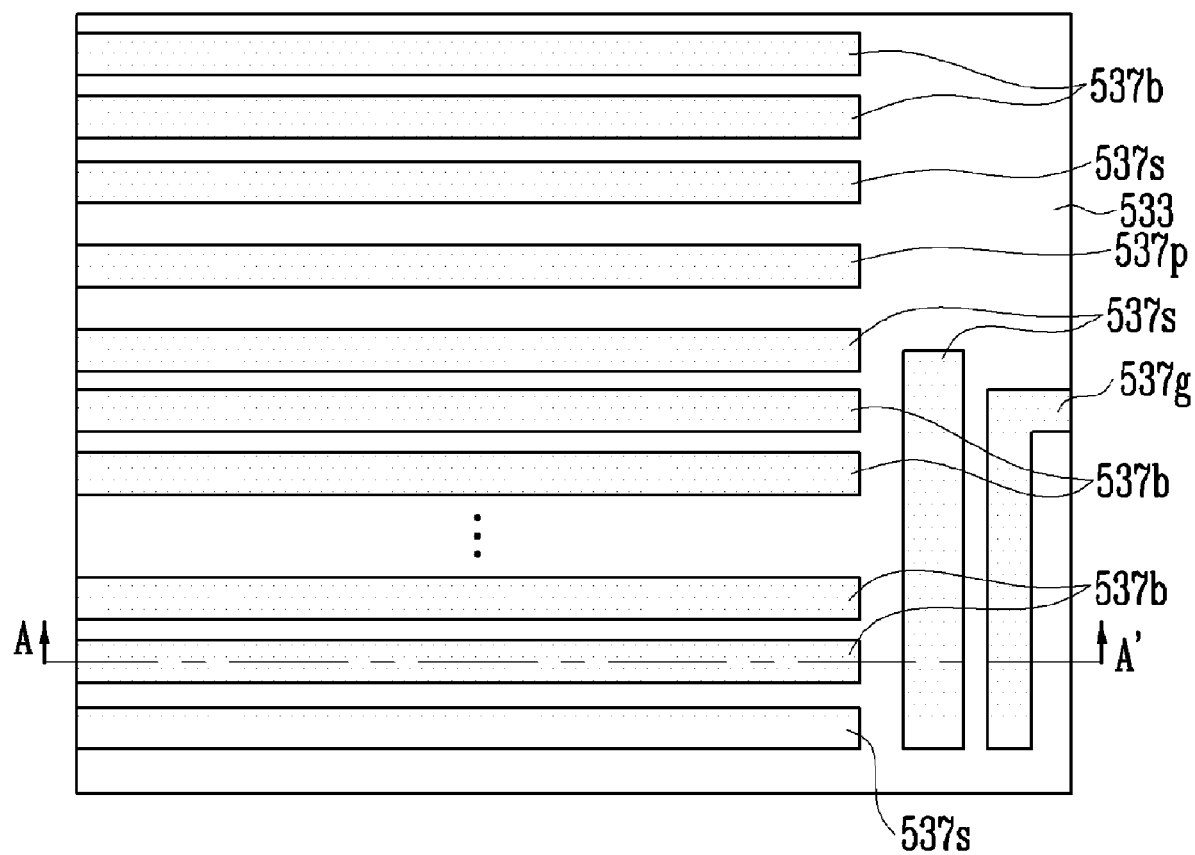
Figure 5F:
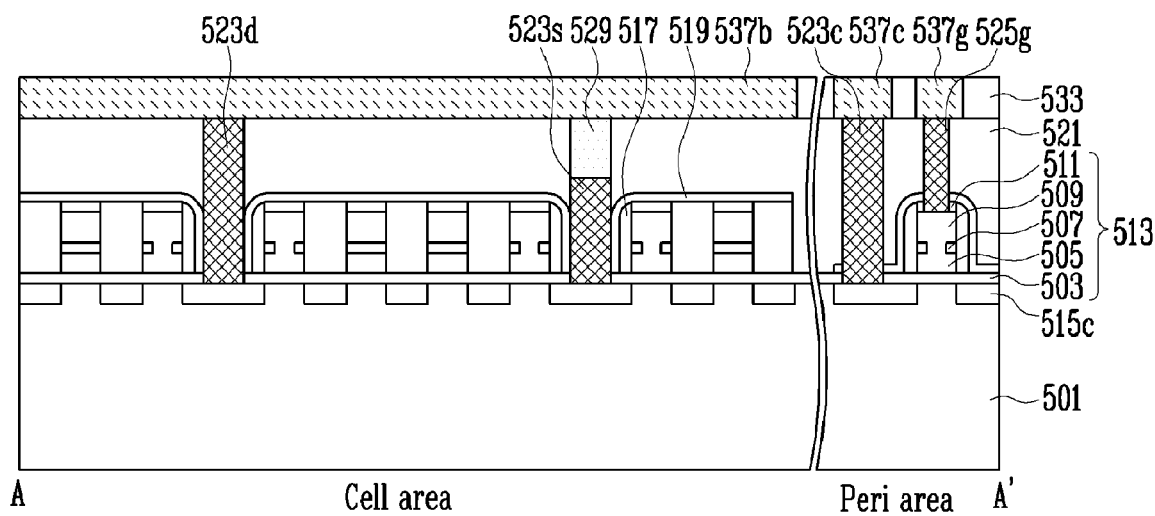

Referring to FIGS. 4E and 5F, the damascene patterns 535s, 535b, 535p, 535c, and 535g are gap-filled with conductive material, thereby forming metal wirings 537b, 537s, 537p, 537c, and 537g. The first metal wirings 537b become bit lines, each connected to the drain contact plugs 523d. The second metal wirings 537s become source lines, each connected to the source contact plugs 523s. The third metal wirings 537p become well pickup lines, each connected to the well pickup plugs 523p. In the peripheral area, the fourth and fifth metal wirings 537c and 537g are connected to the junction plug 523c and the gate plug 523g, respective.

Figure 6A:
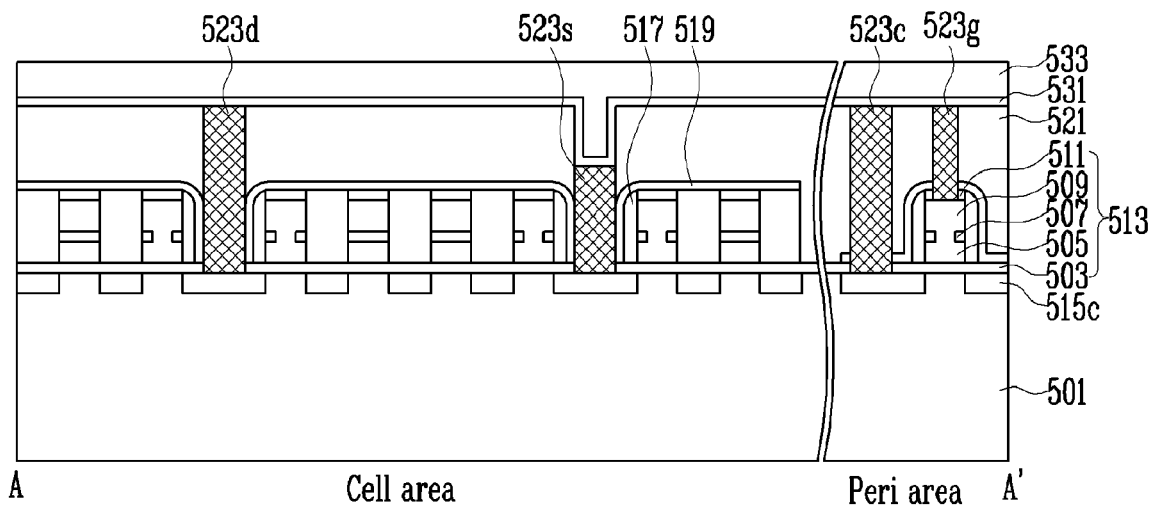
FIGS. 6A and 6B are sectional views showing a method of forming metal wirings of a nonvolatile memory device of still yet another embodiment.
Figure 6B:
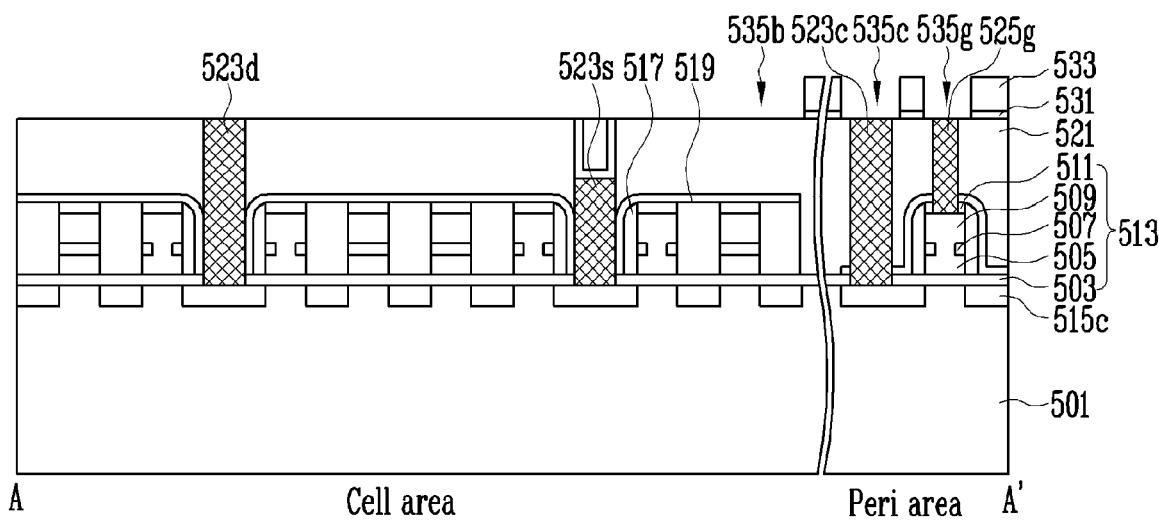

FIGS. 6A and 6B are sectional views showing a method of forming metal wirings of a nonvolatile memory device of still yet another embodiment.

Referring to FIG. 6A, a recess is formed on source contact plugs 523s using the method described with reference to FIGS. 4A, 4B and 5A to 5C. An etch-stop layer 531 is formed along a surface of the source contact plugs 523s, including the recess, and a first dielectric interlayer 521. A second dielectric interlayer 533 is formed on the etch-stop layer 531 in such a way as to gap-fill the recess. After the second dielectric interlayer 533 is formed, a polishing process may be performed.

Referring to FIG. 6B, after the second dielectric interlayer 533 is etched, the exposed etch-stop layer 521 is etched, thereby forming damascene patterns 535s, 535b, 535p, 535c, and 535g as in FIG. 4B. At this time, the second dielectric interlayer 533 is back-etched to remain in the recess on the source contact plugs 523s. The second dielectric interlayer 533 that remains in the recess as described above serves as an insulating layer, similar to the insulating layer 529 shown in FIG. 5D. That is, the second dielectric interlayer 533 remaining in the recess prevents a central portion of the source contact plugs 523s from being exposed, thus preventing the metal wirings for bit lines from connecting to the source contact plugs 523s. Thereafter, as shown in FIG. 4E, metal wirings 537s, 537b, 537p, 537c, and 537g are formed.

Figure 7A:
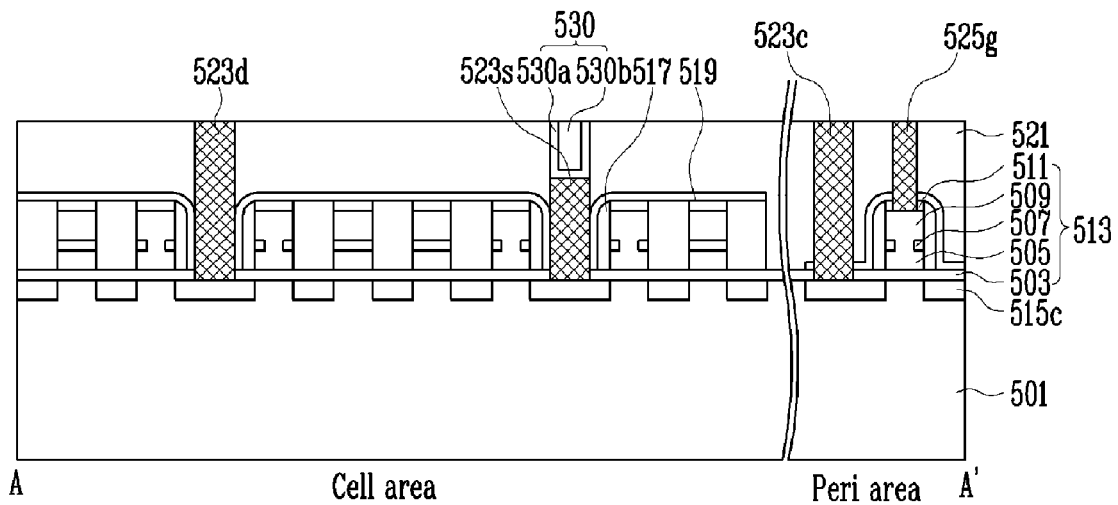
FIGS. 7A and 7B are sectional views showing a method of forming metal wirings of a nonvolatile memory device of still yet another embodiment.
Figure 7B:
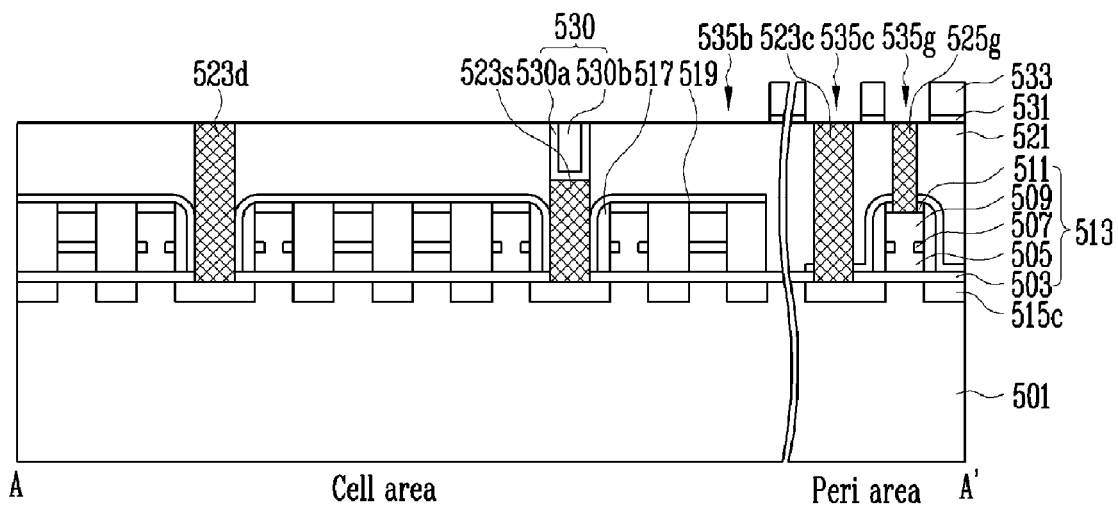

FIGS. 7A and 7B are sectional views showing a method of forming metal wirings of a nonvolatile memory device of still yet another embodiment.

Referring to FIG. 7A, a recess is formed on source contact plugs 523s using the method described with reference to FIGS. 4A, 4B and 5A to 5C. A first etch-stop layer 530a is formed along a surface of the source contact plugs 523s, including the recess, and a first dielectric interlayer 521. After a first insulating layer 530b is formed filling the recess in the first etch-stop layer 530a, it is etched such that the only remaining portions are in the recess. Here, the insulating layer 530 may be etched by a CMP process. Thus, insulating layer 530 remains in the recesses on the source contact.

Referring to FIG. 7B, a second etch-stop layer 531 and a second dielectric interlayer 533 are formed over the first dielectric interlayer 521. The exposed etch-stop layer 521 is etched after the second dielectric interlayer 533, thereby forming damascene patterns 535s, 535b, 535p, 535c, and 535g as shown in FIG. 4B. At this time, the second dielectric interlayer 533 is etched-back leaving a portion of the insulating layer 530 in the recess on the source contact plugs 523s. The insulating layer 530 remaining in the recess as described above is similar to insulating layer 529 shown in FIG. 5D. That is, the insulating layer 530 covers a central portion of the source contact plugs 523s, insulating the metal wirings for bit lines and the source contact plugs 523s from each other.

In the above third to fifth embodiments, it has been described that the metal wirings are formed using a damascene method. However, the metal wirings may be formed using a patterning process by gap-filling the recess on the source contact plugs 523s with the insulating layer 529 and then forming a conductive layer on the first dielectric interlayer 521.

As described above, when contact plugs and metal wirings cross each other, but must remain electrically isolated, a recess is formed on the contact plugs, an insulating layer is formed in the recess, and metal wirings are then formed. Accordingly, the contact plugs and the metal wiring, which intersect while using one dielectric interlayer there between, can be selectively isolated from each other. Here, a second dielectric interlayer is an insulating layer that is only used when forming metal wirings by the damascene. Thus, the intersecting contact plugs and the metal wiring intersect while using the first dielectric interlayer, can be selectively isolated from each other, which is an advantageous design.

Further, in order to isolate intersecting contact plugs and metal wirings from each other, two dielectric interlayers were used. However, in one or more embodiments, one dielectric interlayer is used. Accordingly, an overall height can be lowered.

In addition, since the height of the contact plugs can be lowered, problems with contact holes being formed despite an increased level of integration or the insides of the contact holes not being filled with material for forming the contact plugs can be solved.

What is claimed is:

1. A method of forming metal wirings of a nonvolatile memory device, the method comprising:
    forming a first insulating layer over a semiconductor substrate including a first junction area and a second junction area;
    forming first and second contact holes through the first insulating layer, thereby exposing the first and second junction areas, respectively;
    forming first and second contact plugs within the first and second contact holes;
    etching an exposed upper portion of the second contact plug by using a mask layer as an etching mask, thus forming a recess and a protruding portion, wherein a remaining upper portion of the second contact plug becomes the protruding portion;
    filling the recess, thereby forming a second insulating layer; and
    forming first and second metal wirings respectively coupled to the first contact plug and the protruding portion of the second contact plug, over the resultant semiconductor structure.

2. The method of claim 1, wherein:
    the first junction area is formed in the semiconductor substrate between drain select lines in a flash memory device, and
    the second junction area is formed in the semiconductor substrate between source select lines.

3. The method of claim 1, wherein:
    the first metal wiring extends crosses into a region in which the second contact plug is formed;
    the second insulating layer electrically isolates the first metal wiring and the second contact plug.

4. The method of claim 1, wherein the second contact plugs are formed in a line fashion and electrically connect the second junction areas formed in different areas.

5. The method of claim 1, wherein the recess is formed by etching an upper central portion of and an upper portion of one edge portion of the second contact plug.

6. The method of claim 5, wherein the second metal wiring is connected to an upper portion of the other edge portion of the second contact plug.

7. The method of claim 1, wherein the formation of the second insulating layer includes:
    filling the recess through deposition of the second insulating layer over the semiconductor substrate; and
    etching the second insulating layer to remain only in the recess.

8. The method of claim 7, wherein a chemical mechanical polishing (CMP) process is used for etching.

9. The method of claim 1, wherein the first metal wirings are arranged in parallel between the second metal wirings with connections to the first junction areas formed in different areas.

10. The method of claim 9, wherein 100 to 2000 first metal wirings are connected to different first junction areas, respectively, and intersect the second insulating layer between the metal wirings.

11. A method of forming metal wirings of a nonvolatile memory device, the method comprising:
    forming drain select lines, word lines, and source select lines in a cell area of a semiconductor substrate, and a transistor in a peripheral area of the semiconductor substrate;
    forming a first insulating layer over the drain select lines, word lines, source select lines, and the transistor;
    forming a plurality of contact holes through which a first junction area between the drain select lines, a second junction area between the source select lines, a third junction area of the transistor, and a gate of the transistor are respectively exposed in the first insulating layer;
    forming a plurality of contact plugs within the plurality of contact holes, respectively;
    forming a recess by etching a part of one of the contact plugs and a portion of the first insulating layer;
    filling the recess through deposition of a second insulating layer; and
    forming a plurality of metal wirings, each coupled to the plurality of contact plugs and at least partially over the first and second insulating layers.

12. The method of claim 11, wherein:
    one metal wiring crosses into a region of one of the contact plugs and is isolated from the contact plug by the second insulating layer.

13. The method of claim 11, wherein one of the contact plugs is formed electrically connecting the different second junction areas and in linear fashion.

14. The method of claim 11, wherein the recess is etched into an upper central portion of and an upper portion of one edge portion one of the contact plug.

15. The method of claim 14, wherein one of the metal wiring is connected to an upper portion of the other edge portion of the contact plug.

16. The method of claim 11, wherein the formation of the second insulating layer includes:
    forming the second insulating layer over the semiconductor substrate thereby filling the recess; and
    etching-back the insulating layer leaving portions only in the recess.

17. The method of claim 16, wherein the etch process uses a chemical mechanical polishing (CMP) process.

18. The method of claim 11, wherein the first metal wirings connected to the first junction areas are arranged in parallel between the metal wirings connected to the second junction areas.

19. The method of claim 18, wherein 100 to 2000 of the metal wirings connecting to different first junction areas, respectively, between the second metal wirings.

20. The method of claim 1, wherein the formation of the first and second metal wirings comprises:
forming a third insulating layer over the semiconductor structure including the second insulating layer;
etching the third insulating layer, thereby forming first and second trenches through which the first contact plug and the protruding portion of second contact plug are to be exposed; and
forming the first and second metal wirings within the first and second trenches, respectively.

21. The method of claim 20, further comprising forming an etch-stop layer over the semiconductor structure before the third insulating layer is formed.

22. The method of claim 20, wherein:
the first trench extends across an area in which the second contact plug is formed, and
the first contact plug and the second insulating layer are exposed through the first trench.

23. The method of claim 1, wherein the second insulating layer is formed over the entire semiconductor substrate including the first insulating layer.

24. The method of claim 23, further comprising forming first and second trenches through which the first contact plug and the protruding portion of the second contact plugs are exposed respectively, by etching the second insulating layer over the first insulating layer.

25. The method of claim 24, wherein the first metal wiring is formed in the first trench, and the second metal wiring is formed in the second trench.

26. The method of claim 23, further comprising, before the second insulating layer is formed, forming an etch-stop layer on the upper surface of the first insulating layer including the recess.

27. The method of claim 1, further comprising, before the first and second metal wirings, a diffusion-prevention layer is formed over the semiconductor substrate including the second insulating layer.

28. The method of claim 11, wherein the formation of the plurality of the metal wirings comprises:
forming a third insulating layer over the semiconductor structure including the second insulating layer;
etching the third insulating layer, thereby forming a plurality of trenches through which the plurality of the contact plugs are to be exposed; and
forming the plurality of the metal wirings within the plurality of the trenches, respectively.

29. The method of claim 28, further comprising forming an etch-stop layer over the semiconductor structure before the third insulating layer is formed.

30. The method of claim 11, wherein the second insulating layer is formed over the entire semiconductor substrate including the first insulating layer.

31. The method of claim 30, further comprising forming a plurality of trenches through which the plurality of the contact plugs are exposed respectively, by etching the second insulating layer over the first insulating layer.

32. The method of claim 30, further comprising, before the second insulating layer is formed, forming an etch-stop layer on the upper surface of the first insulating layer including the recess.

33. The method of claim 11, further comprising, before the plurality of the metal wirings, a diffusion-prevention layer is formed over the semiconductor substrate including the second insulating layer.

* * * * *